(12) United States Patent
Choi et al.

(10) Patent No.: US 12,080,663 B2
(45) Date of Patent: Sep. 3, 2024

(54) SEMICONDUCTOR DEVICES INCLUDING A THICK METAL LAYER AND A BUMP

(71) Applicant: Samsung Electronics Co., Ltd., Suwon-si (KR)

(72) Inventors: Minjung Choi, Suwon-si (KR); Sooho Shin, Hwaseong-si (KR); Yeonjin Lee, Suwon-si (KR); Junghoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/377,530

(22) Filed: Oct. 6, 2023

(65) Prior Publication Data

US 2024/0047390 A1 Feb. 8, 2024

Related U.S. Application Data

(63) Continuation of application No. 18/093,880, filed on Jan. 6, 2023, now Pat. No. 11,817,408, which is a
(Continued)

(30) Foreign Application Priority Data

Aug. 9, 2019 (KR) .................. 10-2019-0097284

(51) Int. Cl.
*H01L 23/00* (2006.01)
*H01L 21/56* (2006.01)

(52) U.S. Cl.
CPC ............ *H01L 24/05* (2013.01); *H01L 21/561* (2013.01); *H01L 24/13* (2013.01); *H01L 24/73* (2013.01);
(Continued)

(58) Field of Classification Search
CPC ......... H01L 24/05; H01L 24/13; H01L 24/73; H01L 2224/0401; H01L 2224/12105;
(Continued)

(56) References Cited

U.S. PATENT DOCUMENTS 6,118,180 A 9/2000 Loo et al.
6,130,149 A 10/2000 Chien et al.
(Continued)

FOREIGN PATENT DOCUMENTS

CN 103367295 A * 10/2013 ....... H01L 21/02697
KR 10-2007-0033286 B1 3/2007
(Continued)

OTHER PUBLICATIONS

Office Action issued by the German Patent and Trademark Office on Jul. 26, 2023 for corresponding patent application DE 102020106355.5 (translation provided).
(Continued)

*Primary Examiner* — Mamadou L Diallo
(74) *Attorney, Agent, or Firm* — Muir Patent Law, PLLC

(57) ABSTRACT

A semiconductor device includes an interlayer insulating layer disposed on a substrate; a plurality of middle interconnections disposed in the interlayer insulating layer; a pad disposed on the interlayer insulating layer; an upper interconnection disposed on the interlayer insulating layer; a protective insulating layer covering an edge of the pad, the upper interconnection, and a horizontal gap between the pad and the upper interconnection, the protective insulating layer having an opening on the pad; and a bump disposed on the pad, the bump extending on the protective insulating layer and overlapping the upper interconnection from a top-down view. At least one of the plurality of middle interconnections from among middle interconnections vertically closest to the pad has a first vertical thickness, the pad has a second
(Continued)

vertical thickness that is twice to 100 times the first vertical thickness, a length of the gap between the pad and the upper interconnection is 1 μm or more, and an upper surface of the protective insulating layer is planar.

20 Claims, 10 Drawing Sheets

Related U.S. Application Data continuation of application No. 17/328,365, filed on May 24, 2021, now Pat. No. 11,557,556, which is a continuation of application No. 16/795,658, filed on Feb. 20, 2020, now Pat. No. 11,049,827.

(52) U.S. Cl.
CPC ...... *H01L 24/96* (2013.01); *H01L 2224/0401* (2013.01); *H01L 2224/12105* (2013.01); *H01L 2224/13099* (2013.01); *H01L 2224/81801* (2013.01); *H01L 2924/1304* (2013.01); *H01L 2924/18162* (2013.01)

(58) Field of Classification Search
CPC ..... H01L 24/96; H01L 23/525; H01L 23/485; H01L 24/04; H01L 24/12; H01L 24/28
See application file for complete search history.

(56) References Cited

U.S. PATENT DOCUMENTS

| | | | |
|---|---|---|---|
| 6,184,143 B1 * | 2/2001 | Ohashi | H01L 21/7684 438/692 |
| 6,538,326 B2 | 3/2003 | Shimizu et al. | |
| 6,583,515 B1 * | 6/2003 | James | H05K 3/3452 257/772 |
| 6,614,120 B2 | 9/2003 | Sato et al. | |
| 6,636,313 B2 | 10/2003 | Chen et al. | |
| 6,881,654 B2 | 4/2005 | Chen et al. | |
| 7,170,175 B2 | 1/2007 | Yamagata | |
| 7,642,646 B2 | 1/2010 | Nakamura et al. | |
| 8,071,468 B2 | 12/2011 | Sameshima et al. | |
| 8,084,859 B2 | 12/2011 | Tetani et al. | |
| 8,513,119 B2 | 8/2013 | Chang et al. | |
| 9,520,371 B2 | 12/2016 | Lin et al. | |
| 9,553,060 B2 * | 1/2017 | Omori | H01L 23/293 |
| 9,716,066 B2 | 7/2017 | Lee et al. | |
| 9,824,989 B2 | 11/2017 | Shih et al. | |
| 9,881,885 B2 * | 1/2018 | Kuo | H01L 24/13 |
| 9,929,112 B2 * | 3/2018 | Hsieh | H01L 25/105 |
| 9,978,656 B2 | 5/2018 | Lin et al. | |
| 2004/0256723 A1 | 12/2004 | Akagawa et al. | |
| 2009/0108464 A1 * | 4/2009 | Uchiyama | H01L 21/6835 257/774 |
| 2009/0134527 A1 * | 5/2009 | Chang | H01L 25/0657 438/109 |
| 2010/0117228 A1 * | 5/2010 | Yamamichi | H01L 23/5286 257/E23.141 |
| 2010/0164096 A1 * | 7/2010 | Daubenspeck | H01L 24/13 257/737 |
| 2010/0193687 A1 | 8/2010 | Fujieda et al. | |
| 2010/0193945 A1 | 8/2010 | Hochstenbach et al. | |
| 2010/0330799 A1 * | 12/2010 | Hamanaka | H01L 21/7682 257/E21.585 |
| 2011/0233702 A1 * | 9/2011 | Takahashi | H01L 27/14638 257/E31.127 |
| 2011/0266679 A1 * | 11/2011 | Hotta | H01L 23/585 257/E21.585 |
| 2012/0091520 A1 * | 4/2012 | Nakamura | H10B 12/053 257/303 |
| 2012/0199969 A1 * | 8/2012 | Yokoyama | H01L 24/05 257/737 |
| 2012/0220079 A1 * | 8/2012 | Fujii | H01L 23/544 257/E21.586 |
| 2012/0248605 A1 * | 10/2012 | Yamaguchi | H01L 24/03 257/737 |
| 2013/0256906 A1 * | 10/2013 | Mori | H01L 21/02697 257/774 |
| 2014/0191390 A1 * | 7/2014 | Chuang | H01L 24/05 257/737 |
| 2014/0319522 A1 * | 10/2014 | Daubenspeck | H01L 24/03 257/737 |
| 2017/0092680 A1 * | 3/2017 | Kwon | H01L 24/32 |
| 2017/0154811 A1 * | 6/2017 | Wu | H01L 24/14 |
| 2017/0162500 A1 * | 6/2017 | Lee | H01L 23/49816 |
| 2019/0067228 A1 | 2/2019 | Son et al. | |
| 2019/0103387 A1 | 4/2019 | Tsou et al. | |
| 2021/0272918 A1 * | 9/2021 | Choi | H01L 24/05 |

FOREIGN PATENT DOCUMENTS

| | | |
|---|---|---|
| KR | 10-2016-0093528 B1 | 8/2016 |
| KR | 10-2016-0132053 A | 11/2016 |
| KR | 10-2019-0083170 B1 | 7/2019 |

OTHER PUBLICATIONS

Notice of Allowance dated Jun. 26, 2024 for corresponding application No. KR 10-2019-0097284.

* cited by examiner

SEMICONDUCTOR DEVICES INCLUDING A THICK METAL LAYER AND A BUMP

CROSS-REFERENCE TO RELATED APPLICATION

This U.S. non-provisional patent application is a continuation application of U.S. patent application Ser. No. 18/093,880, filed Jan. 6, 2023, which is a continuation application of U.S. patent application Ser. No. 17/328,365, filed May 24, 2021, which is a continuation application of U.S. patent application Ser. No. 16/795,658, filed Feb. 20, 2020, which claims priority under 35 U.S.C. § 119 to and the benefit of Korean Patent Application No. 10-2019-0097284, filed on Aug. 9, 2019, in the Korean Intellectual Property Office (KIPO), the disclosure of each of which is incorporated herein by reference in its entirety

BACKGROUND

1. Field

Devices and methods consistent with example embodiments relate to semiconductor devices having a thick metal layer and a bump and methods of forming the semiconductor devices.

2. Description of Related Art

Research is being conducted into semiconductor devices adopting bumps formed on electrode pads. A shape of the bump may be determined by a configuration of a protective insulating layer adjacent to the electrode pad and the bump. A step of the bump causes problems such as an increase in contact resistance and bonding defects.

SUMMARY

The example embodiments of the inventive concept are directed to providing semiconductor devices and methods of forming the same, which have improved current drivability, a high signal transmission rate, and high physical/chemical reliability.

According to some embodiments, a semiconductor device includes an interlayer insulating layer disposed on a substrate; a plurality of middle interconnections disposed in the interlayer insulating layer; a pad disposed on the interlayer insulating layer; an upper interconnection disposed on the interlayer insulating layer; a protective insulating layer covering an edge of the pad, the upper interconnection, and a horizontal gap between the pad and the upper interconnection, the protective insulating layer having an opening on the pad; and a bump disposed on the pad, the bump extending on the protective insulating layer and overlapping the upper interconnection from a top-down view. At least one of the plurality of middle interconnections from among middle interconnections vertically closest to the pad has a first vertical thickness, the pad has a second vertical thickness that is twice to 100 times the first vertical thickness, a length of the gap between the pad and the upper interconnection is 1 µm or more, and an upper surface of the protective insulating layer is planar.

According to some embodiments, a semiconductor device includes an interlayer insulating layer disposed on a substrate; a plurality of active/passive elements disposed on the substrate; a plurality of middle interconnections disposed in the interlayer insulating layer; a pad disposed on the interlayer insulating layer; an upper interconnection disposed on the interlayer insulating layer; a protective insulating layer covering an edge of the pad, the upper interconnection, and a gap between the pad and the upper interconnection, the protective insulating layer having an opening on the pad; a bump disposed on the pad, the bump extending on the protective insulating layer and vertically overlapping the upper interconnection; and a through electrode passing through the substrate and connected to the plurality of middle interconnections or the pad. One of the plurality of middle interconnections from among middle interconnections vertically closest to the pad is electrically connected to the pad and has a first vertical thickness, the pad has a second vertical thickness that is twice to 100 times the first vertical thickness, the gap between the pad and the upper interconnection is 1 µm or more, and an upper surface of the protective insulating layer is planar.

According to some embodiments, a semiconductor device includes an interlayer insulating layer disposed on a substrate; a plurality of middle interconnections disposed in the interlayer insulating layer; a pad disposed on the interlayer insulating layer; an upper interconnection disposed on the interlayer insulating layer; a protective insulating layer covering an edge of the pad, the upper interconnection, and a gap between the pad and the upper interconnection, the protective insulating layer having an opening on the pad; and a bump disposed on the pad, the bump extending on the protective insulating layer and vertically overlapping the upper interconnection. One of the plurality of middle interconnections from among middle interconnections vertically closest to the pad has a first vertical thickness, the pad has a second vertical thickness that is twice to 100 times the first vertical thickness, and a horizontal length of the gap between the pad and the upper interconnection is greater than or equal to the second vertical thickness, and an upper surface of the protective insulating layer is planar.

DETAILED DESCRIPTION OF EXEMPLARY EMBODIMENTS

Figure 1:
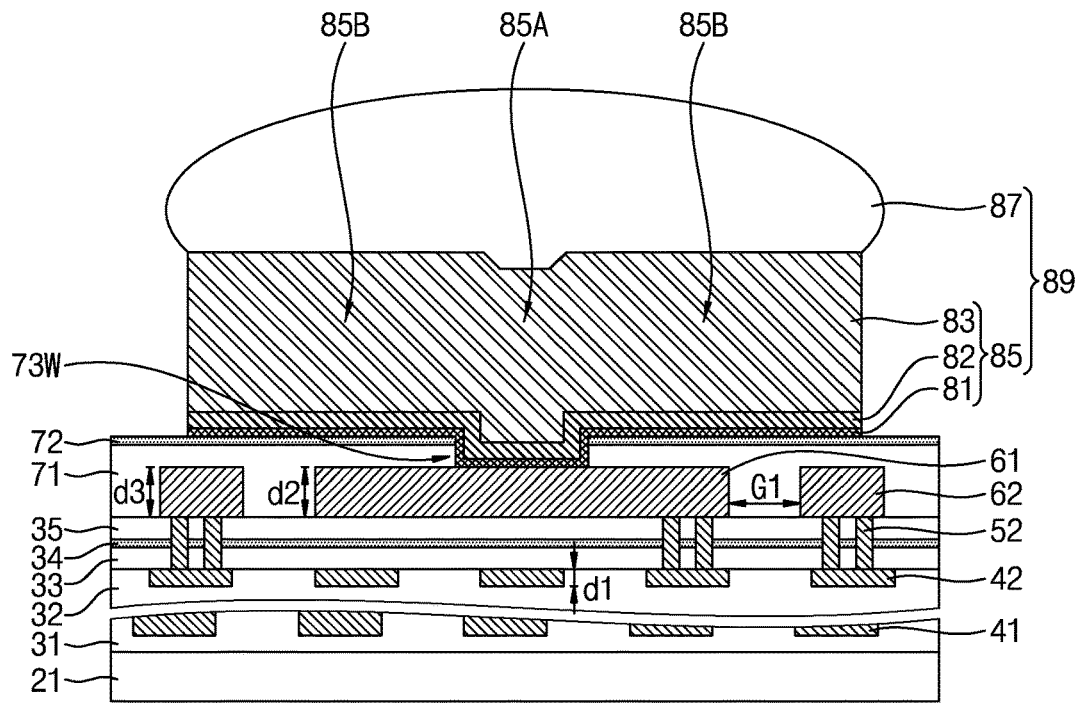
FIGS. 1 to 3 are cross-sectional views each illustrating a portion of a semiconductor device according to embodiments of the inventive concept.
Figure 2:
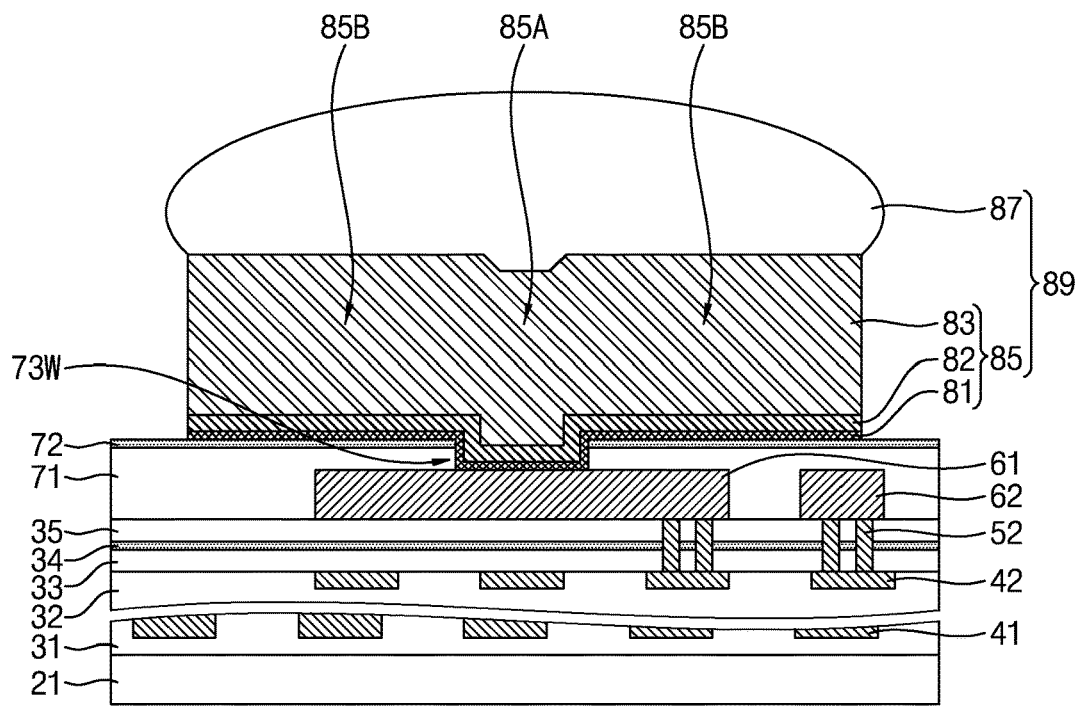
Figure 3:
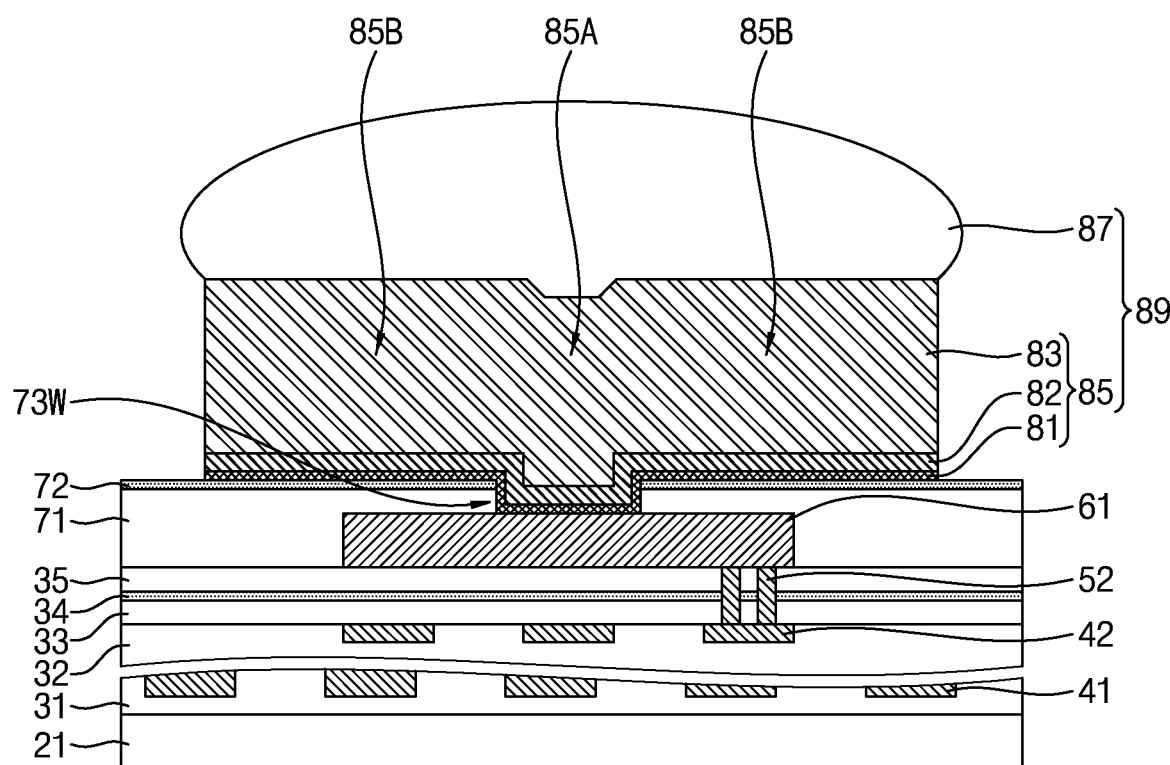
Figure 4:
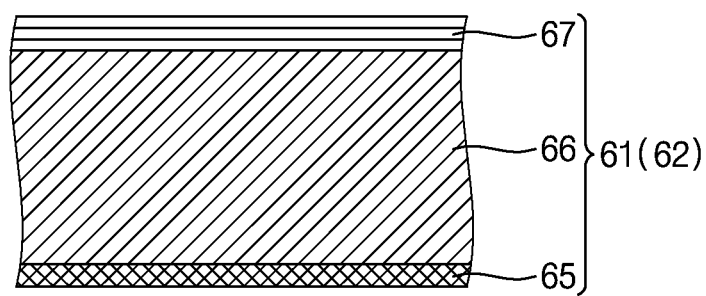
FIG. 4 is an enlarged view illustrating portions of FIGS. 1 to 3.

FIGS. 1 to 3 are cross-sectional views each illustrating a portion of a semiconductor device according to embodiments of the inventive concept. FIG. 4 is an enlarged view illustrating portions of FIGS. 1 to 3. The semiconductor devices according to the embodiments of the inventive concept may include a thick top metal (TTM). A semiconductor device, as described herein, may include a semiconductor chip or die including connection terminals to an external device, may include a semiconductor package including one or more semiconductor chips disposed on a package substrate, and including connection terminals to an external device, or may include a package-on-package device.

Referring to FIG. 1, semiconductor devices according to an embodiment of the inventive concept may include a substrate 21, a plurality of interlayer insulating layers 31, 32, 33, 34, and a plurality of middle interconnections 41 and 42, a plurality of contact plugs 52, a pad 61, a plurality of upper interconnections 62, a plurality of protective insulating layers 71 and 72, an opening 73W, and a first bump 89. The plurality of interlayer insulating layers 31, 32, 33, 34, and 35 may include a first interlayer insulating layer 31, a second interlayer insulating layer 32, a third interlayer insulating layer 33, a fourth interlayer insulating layer 34, and a fifth interlayer insulating layer 35. Two or more adjacent layers of the plurality of interlayer insulating layers 31, 32, 33, 34, and 35 may be together be described as an interlayer insulating layer. The plurality of middle interconnections 41 and 42 may include a plurality of first middle interconnections 41 and a plurality of second middle interconnections 42. The plurality of protective insulating layers 71 and 72 may together be described as a protective insulating layer, and may include a first protective insulating layer 71 and a second protective insulating layer 72. The first bump 89 may include a pillar structure 85 and a solder 87. The pillar structure 85 may have a mostly flat top and bottom surface and substantially vertical side surfaces. The solder 87 may have a mostly flat bottom surface, but a rounded, curved top surface and side surface. The pillar structure 85 may include a barrier layer 81, a seed layer 82, and a pillar 83. The pillar structure 85 may include a first portion 85A and a second portion 85B.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Also, the various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The first to fifth interlayer insulating layers 31 to 35 may be sequentially stacked on the substrate 21. Each of the plurality of middle interconnections 41 and 42 may be disposed in the first to fifth interlayer insulating layers 31 to 35 on the substrate 21. The plurality of second middle interconnections 42 may be disposed relatively farther from an upper surface of the substrate 21 than the plurality of first middle interconnections 41. For example, the plurality of first middle interconnections 41 may be disposed in the first interlayer insulating layer 31. The plurality of second middle interconnections 42 may be disposed in the second interlayer insulating layer 32. The plurality of second middle interconnections 42 may exhibit a first thickness d1.

The plurality of contact plugs 52 may extend into the plurality of interlayer insulating layers 31, 32, 33, 34, and 35. In an embodiment, each of the plurality of contact plugs 52 may pass through the fifth interlayer insulating layer 35, the fourth interlayer insulating layer 34, and the third interlayer insulating layer 33 and may contact a corresponding one of the plurality of second middle interconnections 42. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). The term "contact," as used herein, refers to a direction connection (i.e., touching) unless the context indicates otherwise.

The pad 61 and the plurality of upper interconnections 62 may be disposed at a higher level (e.g., higher vertical level) than the plurality of middle interconnections 41 and 42, with respect to a top surface of the substrate 21. In an embodiment, the pad 61 and the plurality of upper interconnections 62 may be disposed directly on the fifth interlayer insulating layer 35. The pad 61 and the plurality of upper interconnections 62 may be physically and electrically connected to the plurality of contact plugs 52. For example, the pad 61 and each of the plurality of upper interconnections 62 may contact an upper surface of at least a corresponding one of the plurality of contact plugs 52.

The plurality of middle interconnections 41 and 42 may be disposed between the pad 61 and the substrate 21. The pad 61 and the plurality of upper interconnections 62 may be physically and electrically connected to the plurality of second middle interconnections 42 via the plurality of contact plugs 52. The plurality of second middle interconnections 42 may be vertically closer to the pad 61 than the plurality of first middle interconnections 41 are with respect to the pad 61, and may be the closest middle interconnections to the pad 61 from among the middle interconnections 41 and 42, in a vertical direction (e.g., the most adjacent to the pad 61 in the vertical direction). In an embodiment, a selected one of the plurality of second middle interconnections 42 may be closest to the pad 61 from among the plurality of middle interconnections 41 and 42. Also, a selected one of the plurality of second middle interconnections 42 may be electrically connected to the pad 61, for example, through contact plugs 52. Each of the plurality of middle interconnections 41 and 42 may have a lateral width greater than a vertical height thereof. Each of the plurality of contact plugs 52 may have a vertical height greater than a lateral width thereof.

The pad 61 may exhibit a second thickness d2. Each of the plurality of upper interconnections 62 may exhibit a third thickness d3. In an embodiment, the pad 61 and the plurality of upper interconnections 62 may include the same material formed simultaneously. The third thickness d3 may be substantially equal to the second thickness d2. The pad 61 and the plurality of upper interconnections 62 may be disposed at substantially the same vertical level. Lower surfaces of the pad 61 and the plurality of upper interconnections 62 may be substantially coplanar. Upper surfaces of the pad 61 and the plurality of upper interconnections 62 may be substantially coplanar.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second thickness d2 may be greater than the first thickness d1. The second thickness d2 may be at least twice the first thickness d1. In an embodiment, the second thickness d2 may be twice to 100 times the first thickness d1, and in some embodiments, the second thickness d2 may be three times to ten times the first thickness d1. The second thickness d2 may be 1 μm or more. In an embodiment, the second thickness d2 may range from 1 μm to 5 μm. The first thickness d1, in some embodiments, may range from 0.01 μm to 0.5 μm. For example, in one embodiment, the second thickness d2 may be about 2.5 μm. An interconnection resistance may be reduced due to thicknesses (i.e., the second and third thicknesses d2 and d3) of the pad 61 and the plurality of upper interconnections 62. Configurations of the pad 61 and the plurality of upper interconnections 62 may have an effect of increasing current drivability.

Each of the plurality of upper interconnections 62 may be disposed adjacent to the pad 61. Each of the plurality of upper interconnections 62 may be spaced apart from the pad 61. Each gap G1 between the plurality of upper interconnections 62 and the pad 61 may be 1 μm or more. Each of the gaps G1 between the plurality of upper interconnections 62 and the pad 61 may range from 1 μm to 10 μm. In an embodiment, each of the gaps G1 may range from 2.5 μm to 7.2 μm. Each of the gaps G1 between the plurality of upper interconnections 62 and the pad 61 may be greater than or equal to the second thickness d2. Signal delays, such as a resistance-capacitance (RC) delay, may be minimized due to the gaps G1 between the plurality of upper interconnections 62 and the pad 61. The configurations of the pad 61 and the plurality of upper interconnections 62 may have an effect of increasing operation speed. Though not shown in FIG. 1, in example embodiments showing features similar of FIG. 1 or other figures, from a top-down view, pad 61 has a substantially circular shape or may have a square, rectangular, or linear shape (e.g., elongated rectangular shape), and upper interconnections 62 have a linear shape (e.g., elongated rectangular shape).

The plurality of protective insulating layers 71 and 72 may cover an edge of the pad 61 (e.g., a lateral side or lateral sides, and the adjacent upper surface of the pad 61), the plurality of upper interconnections 62, and the gaps G1 between the pad 61 and the plurality of upper interconnections 62. The opening 73W may be disposed on the pad 61 and pass through the plurality of protective insulating layers 71 and 72. For example, the opening 73W may pass through the entire protective insulating layer 72 and part of the protective insulating layer 71. Upper surfaces of the plurality of protective insulating layers 71 and 72 may be substantially planar.

The first protective insulating layer 71 may cover the edge of the pad 61, the plurality of upper interconnections 62, and the gaps G1 between the pad 61 and the plurality of upper interconnections 62. The upper surface of the first protective insulating layer 71 may be substantially planar. The second protective insulating layer 72 may be disposed on the first protective insulating layer 71. The second protective insulating layer 72 may include, or be formed of, a different material from the first protective insulating layer 71. The upper surface of the second protective insulating layer 72 may be substantially planar.

In an exemplary embodiment, each of the first protective insulating layer 71 and the second protective insulating layer 72 may include a single layer or a multi-layered structure. Each of the first protective insulating layer 71 and the second protective insulating layer 72 may include a first oxide layer such as high-density plasma (HDP) oxide, a second oxide layer formed using tetraethyl orthosilicate (TEOS) or fluorinated tetraethyl orthosilicate (FTEOS), or a combination thereof.

The first bump 89 may be disposed on the pad 61 and extend on the plurality of protective insulating layers 71 and 72 and overlap the plurality of upper interconnections 62. The first bump 89 may extend into the plurality of protective insulating layers 71 and 72 and be connected to the pad 61 through the opening 73W, for example by contacting the pad 61 through the opening 73W. In this manner, a first part of the bottom surface of the first bump 89 may contact a top surface of the pad 61 through the opening 73W and a second part of the bottom surface of the first bump 89 may contact a top surface of an uppermost layer of the protective insulating layer (e.g., layers 71 and 72). The pillar structure 85 may be disposed on the pad 61 and extend on the plurality of protective insulating layers 71 and 72 and overlap the plurality of upper interconnections 62. The pillar structure 85 may extend into the plurality of protective insulating layers 71 and 72 and be connected to the pad 61 through the opening 73W. The solder 87 may be disposed on the pillar structure 85.

The first portion 85A of the pillar structure 85 may be arranged on the opening 73W. The second portion 85B of the pillar structure 85 may extend on the plurality of protective insulating layers 71 and 72. The second portion 85B may overlap the edge of the pad 61, the plurality of upper interconnections 62, and the gaps G1 between the pad 61 and the plurality of upper interconnections 62. For example, in one embodiment, the pillar structure 85 and the solder 87 are substantially circular from a top-down view, and the first portion 85A is surrounded by the second portion 85B, each of which are substantially circular.

A lower surface of the second portion 85B may contact a top of the second protective insulating layer 72. The lower surface of the second portion 85B may be formed to be substantially planar. The first portion 85A may extend into the plurality of protective insulating layers 71 and 72 and be connected to the pad 61 through the opening 73W. A lower surface of the first portion 85A may be in contact with the pad 61. An upper surface of the first portion 85A may be closer to the substrate 21 than an upper surface of the second portion 85B. An upper surface of the second portion 85B may be formed to be substantially planar. Physical and chemical reliability of the first bump 89 may be ensured due to planar configurations of the first protective insulating layer 71, the second protective insulating layer 72, and the pillar structure 85.

Referring to FIG. 2, semiconductor devices according to an embodiment of the inventive concept may include a substrate 21, a plurality of interlayer insulating layers 31, 32, 33, 34, and a plurality of middle interconnections 41 and 42, a plurality of contact plugs 52, a pad 61, an upper interconnection 62, a plurality of protective insulating layers 71 and 72, an opening 73W, and a first bump 89. The upper interconnection 62 may be disposed on one side of the pad 61. The pad 61 and the upper interconnection 62 may be disposed at substantially the same level. An upper surface of each of the first protective insulating layer 71 and the second protective insulating layer 72 may be substantially planar.

Referring to FIG. 3, semiconductor devices according to an embodiment of the inventive concept may include a substrate 21, a plurality of interlayer insulating layers 31, 32, 33, 34, and a plurality of middle interconnections 41 and 42, a plurality of contact plugs 52, a pad 61, a plurality of protective insulating layers 71 and 72, an opening 73W, and a first bump 89. This example does not include contact plugs 52 or upper interconnections 62. An upper surface of each of a first protective insulating layer 71 and a second protective insulating layer 72 may be substantially planar.

Referring to FIG. 4, the pad 61 and each of the plurality of upper interconnections 62 may include a lower barrier layer 65, a conductive layer 66, and an upper barrier layer 67. The conductive layer 66 may be interposed between the lower barrier layer 65 and the upper barrier layer 67. In an embodiment, the lower barrier layer 65 may include a titanium (Ti) layer. The conductive layer 66 may include an aluminum (Al) layer or a copper (Cu) layer. The upper barrier layer 67 may include a titanium/titanium nitride (Ti/TiN) layer (e.g., it may include more than one layer such as a titanium layer covered with a titanium nitride layer).

FIGS. 5 to 8 are cross-sectional views illustrating portions of semiconductor devices according to embodiments of the inventive concept.

Figure 5:
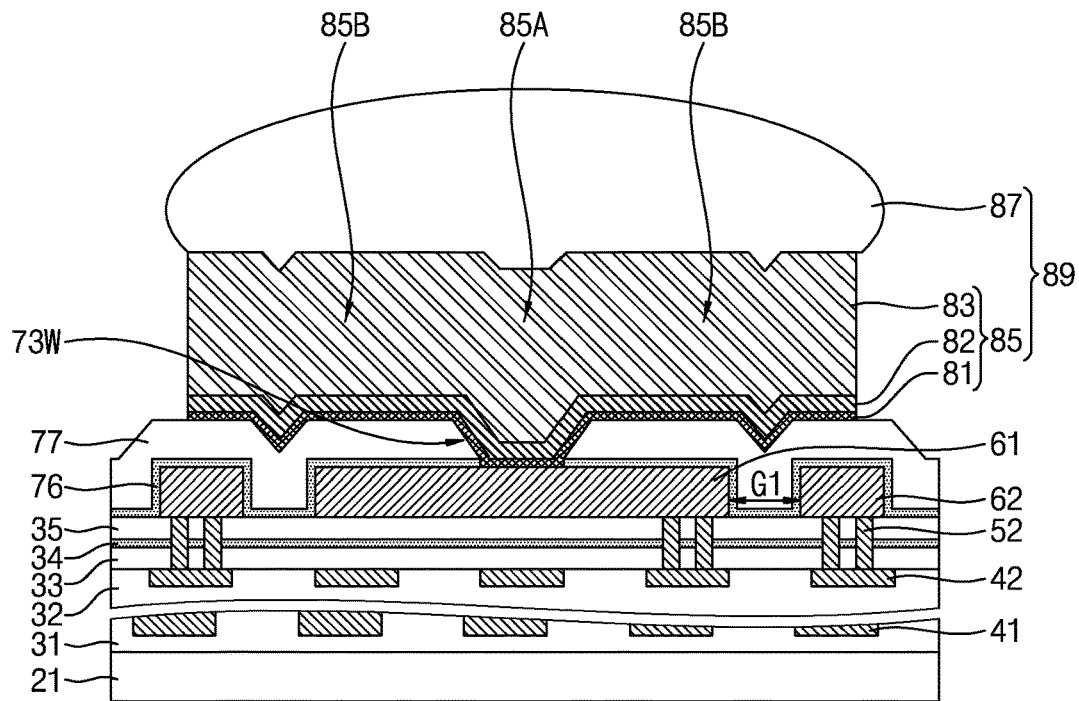
FIGS. 5 to 8 are cross-sectional views each illustrating a portion of a semiconductor device according to embodiments of the inventive concept.

Referring to FIG. 5, semiconductor devices according to an embodiment of the inventive concept may include a substrate 21, a plurality of interlayer insulating layers 31, 32, 33, 34, and 35, a plurality of middle interconnections 41 and 42, a plurality of contact plugs 52, a pad 61, a plurality of upper interconnections 62, a plurality of protective insulating layers 76 and 77, an opening 73W, and a first bump 89. The plurality of protective insulating layers 76 and 77 may include a first protective insulating layer 76 and a second protective insulating layer 77.

In an embodiment, the first protective insulating layer 76 may include silicon nitride, and the second protective insulating layer 77 may include silicon oxide. The first protective insulating layer 76 may conformally cover surfaces of the fifth interlayer insulating layer 35, the pad 61, and the plurality of upper interconnections 62. The second protective insulating layer 77 may cover the first protective insulating layer 76. The opening 73W may pass through the second protective insulating layer 77 and the first protective insulating layer 76. An upper surface of the second protective insulating layer 77 may include a plurality of concave portions which are each disposed between the pad 61 and one of the plurality of upper interconnections 62. A lower surface of a pillar structure 85 may include a plurality of convex portions which are disposed between the pad 61 and the plurality of upper interconnections 62 from a top-down view, and which correspond to the plurality of concave portions of the second protective insulating layer 77. An upper surface of the pillar structure 85 may include a plurality of concave portions which are disposed between the pad 61 and the plurality of upper interconnections 62 from a top-down view, and which correspond to and vertically overlap the plurality of convex portions of the pillar structure 85 and the plurality of concave portions of the second protective insulating layer 77.

Figure 6:
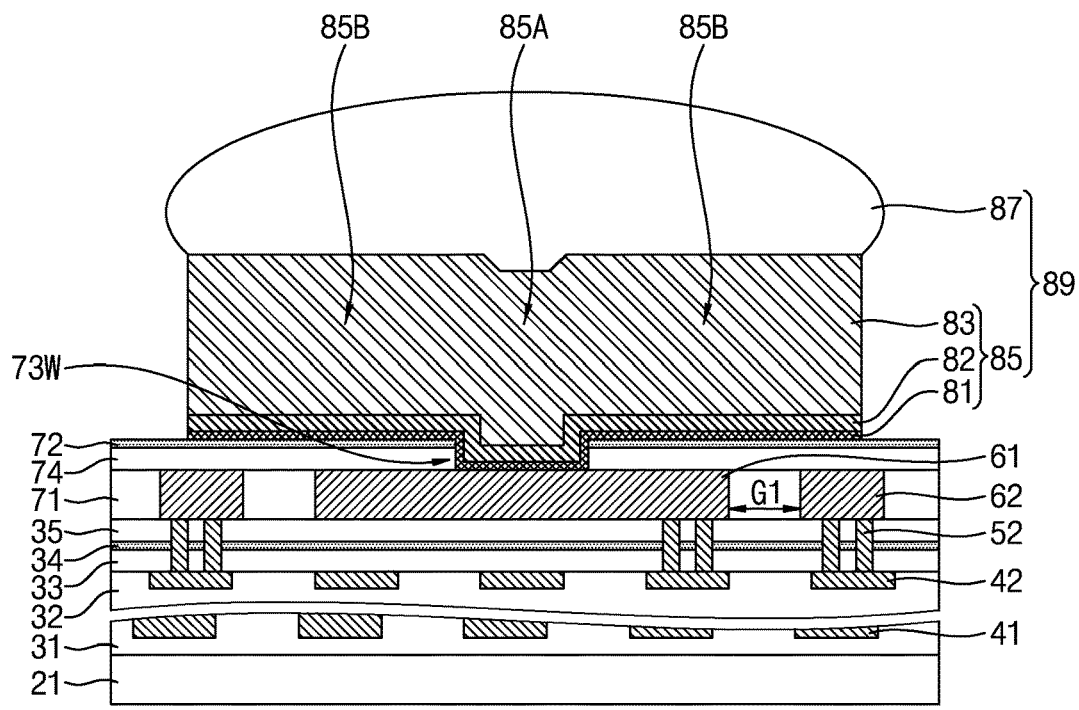

Referring to FIG. 6, semiconductor devices according to an embodiment of the inventive concept may include a substrate 21, a plurality of interlayer insulating layers 31, 32, 33, 34, and a plurality of middle interconnections 41 and 42, a plurality of contact plugs 52, a pad 61, a plurality of upper interconnections 62, a plurality of protective insulating layers 71, 72, and 74, an opening 73W, and a first bump 89. The plurality of protective insulating layers 71, 72, and 74 may include a first protective insulating layer 71, a second protective insulating layer 72, and a third protective insulating layer 74. The third protective insulating layer 74 may be disposed between the first protective insulating layer 71 and the second protective insulating layer 72. The third protective insulating layer 74 may include, or be formed of, a different material from the second protective insulating layer 72. The third protective insulating layer 74 may be formed in a later process from the first protective insulating layer 71. A bottom surface of the third protective insulating layer 74 may contact a top surface of the first protective insulating layer 71 at an interface therebetween.

Upper surfaces of the first protective insulating layer 71, the pad 61, and the plurality of upper interconnections 62 may be substantially coplanar. The first protective insulating layer 71 may fill gaps G1 between the pad 61 and the plurality of upper interconnections 62. The third protective insulating layer 74 may cover an edge of the pad 61, the plurality of upper interconnections 62, and the gaps G1 between the pad 61 and the plurality of upper interconnections 62. An upper surface of each of the first protective insulating layer 71, the second protective insulating layer 72, and the third protective insulating layer 74 may be substantially planar. The opening 73W may pass through the second protective insulating layer 72 and the third protective insulating layer 74.

Figure 7:
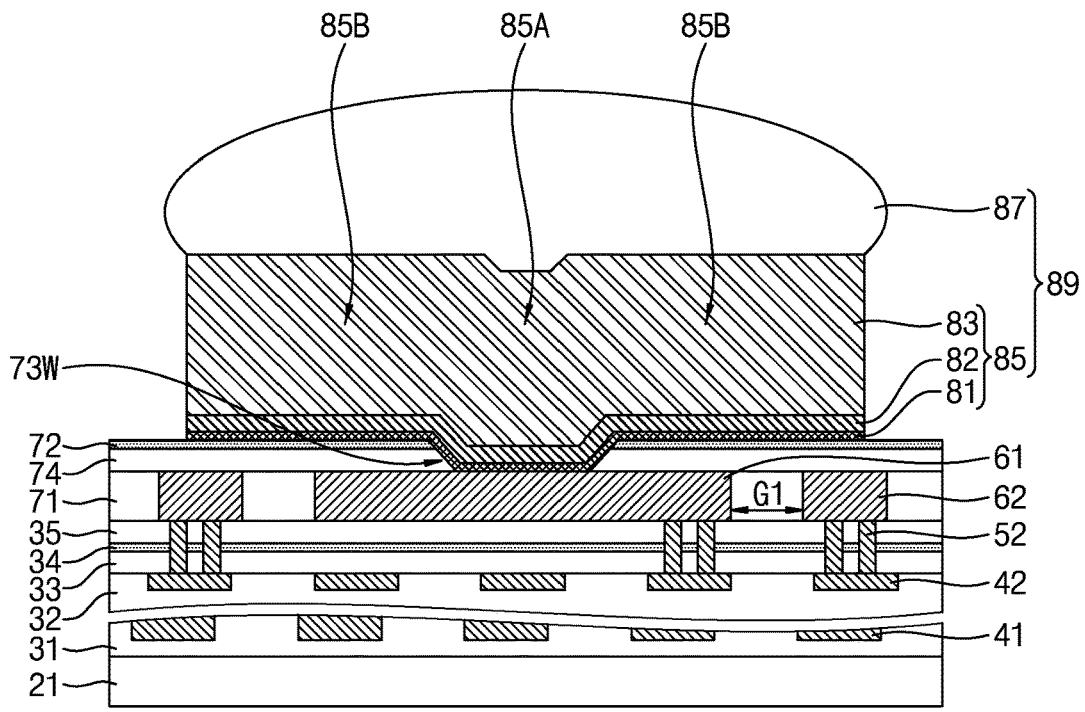

Referring to FIG. 7, semiconductor devices according to an embodiment of the inventive concept may include a substrate 21, a plurality of interlayer insulating layers 31, 32, 33, 34, and a plurality of middle interconnections 41 and 42, a plurality of contact plugs 52, a pad 61, a plurality of upper interconnections 62, a plurality of protective insulating layers 71, 72, and 74, an opening 73W, and a first bump 89. The opening 73W may exhibit a trapezoidal shape from a cross-sectional view, having a lower width smaller than an upper width thereof. Sidewalls of the opening 73W may be inclined, so that a width of the opening 73W increases in a direction away from a top surface of the substrate 21.

Figure 8:
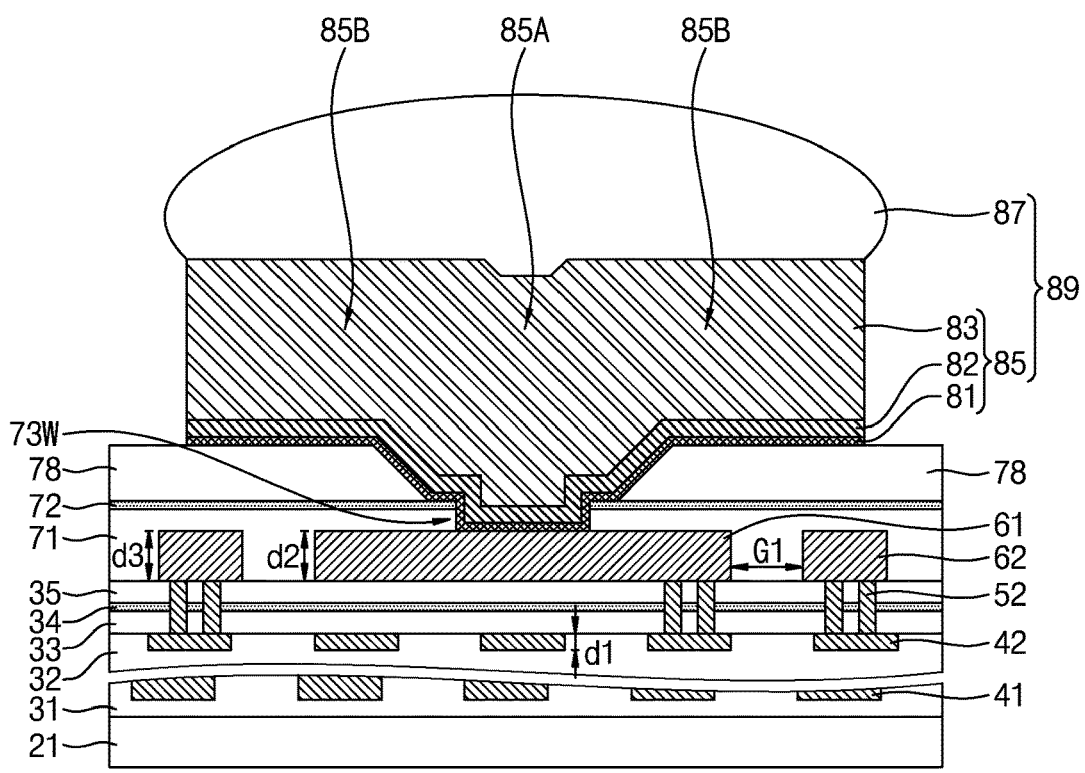

Referring to FIG. 8, semiconductor devices according to an embodiment of the inventive concept may include a substrate 21, a plurality of interlayer insulating layers 31, 32, 33, 34, and 35, a plurality of middle interconnections 41 and 42, a plurality of contact plugs 52, a pad 61, a plurality of upper interconnections 62, a plurality of protective insulating layers 71, 72, and 78, an opening 73W, and a first bump 89. The plurality of protective insulating layers 71, 72, and 78 may include a first protective insulating layer 71, a second protective insulating layer 72, and a third protective insulating layer 78.

The third protective insulating layer 78 may be disposed on the second protective insulating layer 72. In an embodiment, the third protective insulating layer 78 may include photosensitive polyimide (PSPI). The opening 73W may pass through the third protective insulating layer 78, the second protective insulating layer 72, and the first protective insulating layer 71. The opening may be partly rectangular from a cross-sectional view, and partly trapezoidal. The first bump 89 may extend into the plurality of protective insulating layers 71, 72, and 78 and be connected to the pad 61 through the opening 73W.

Figure 9:
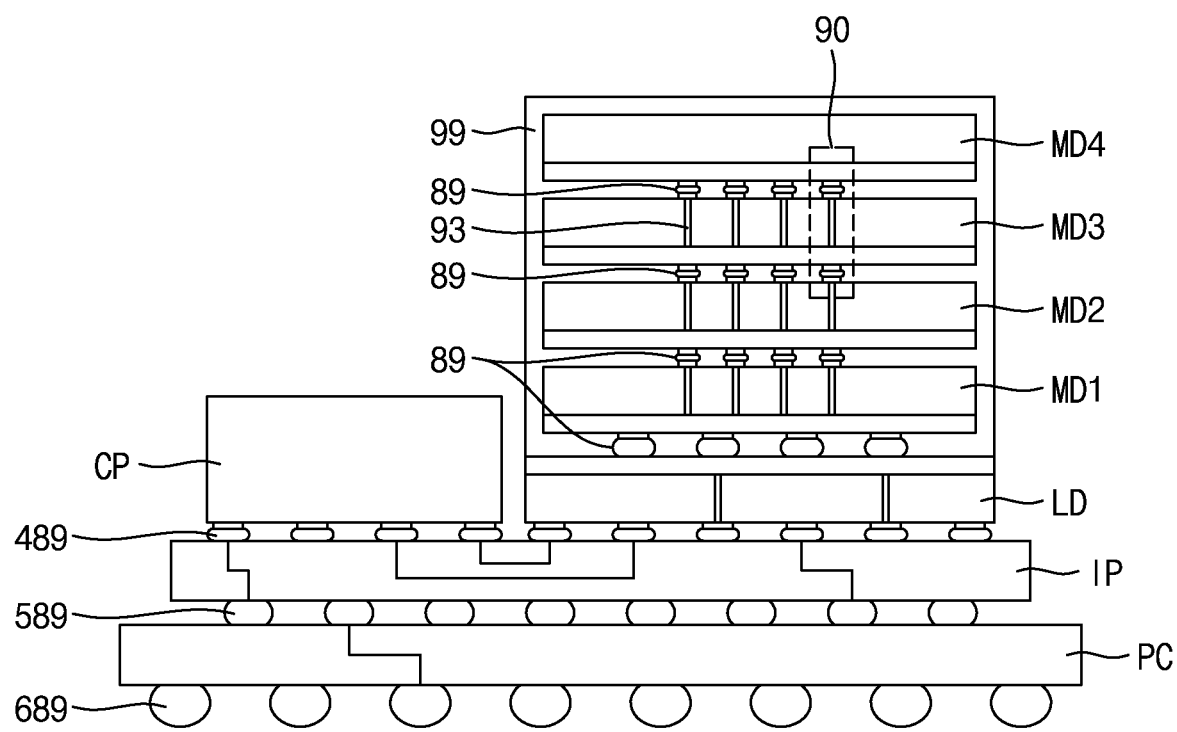
FIG. 9 is a cross-sectional view illustrating semiconductor devices according to embodiments of the inventive concept.
Figure 10:
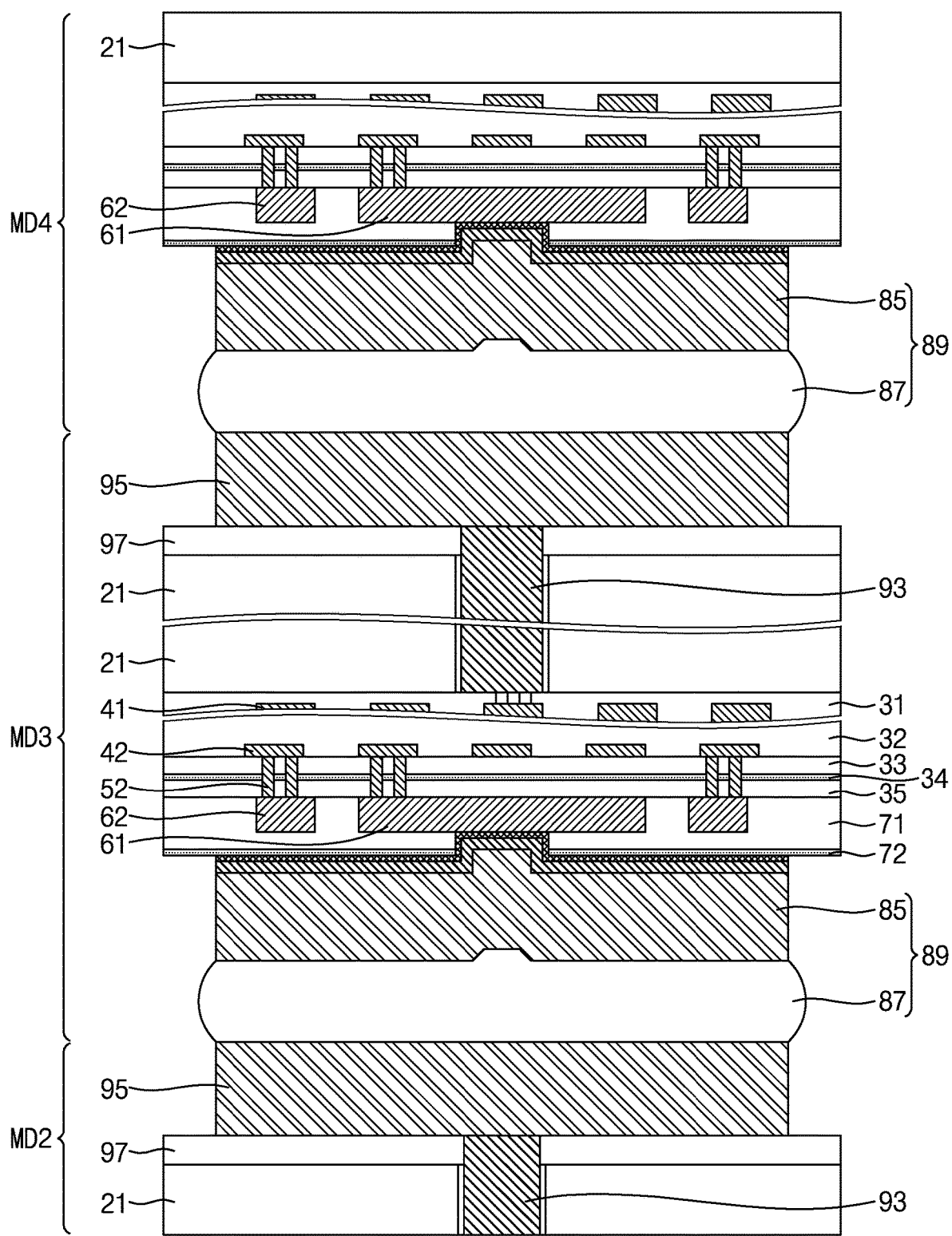
FIG. 10 is an enlarged view of a portion of FIG. 9.
Figure 11:
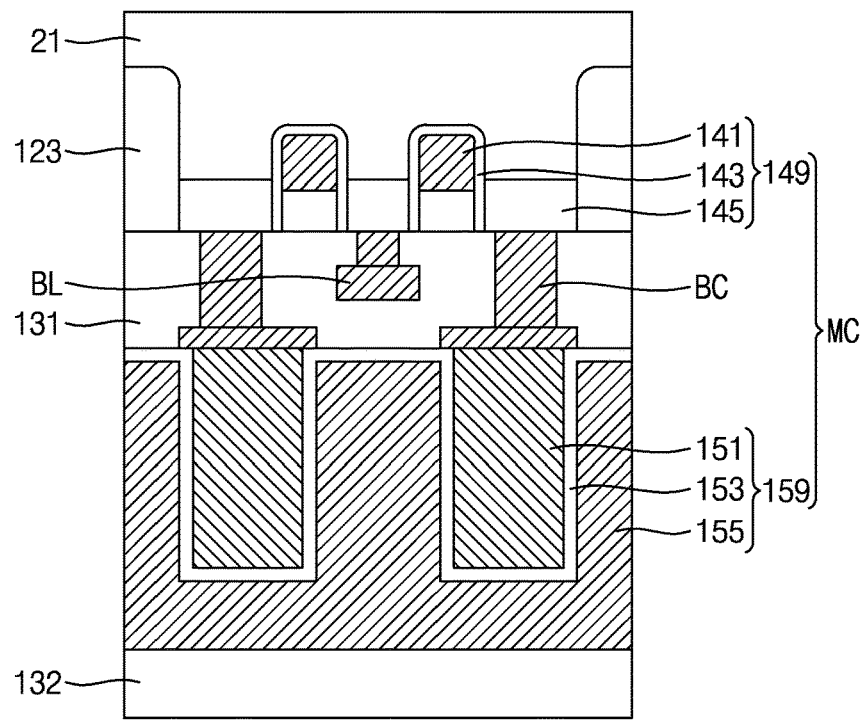
FIG. 11 is an enlarged view of some components of FIG. 9.

FIG. 9 is a cross-sectional view illustrating a semiconductor device according to embodiments of the inventive concept. FIG. 10 is an enlarged view of a portion 90 of FIG. 9. FIG. 11 is an enlarged view of some components of FIG. 9. A semiconductor device according to certain embodiments of the inventive concept may include a multi-chip package. In an embodiment, a semiconductor device may include a high-bandwidth memory (HBM). In an embodiment, a semiconductor device may include dynamic random access memory (DRAM).

Referring to FIG. 9, a semiconductor device may include a printed circuit board (PCB) PC, an interposer IP, a plurality of semiconductor chips CP, LD, and MD1 to MD4, a plurality of bumps 89, 489, 589, and 689, and an encapsulant 99. The plurality of semiconductor chips CP, LD, and MD1 to MD4 may include a microprocessor CP, a control chip LD (e.g., controller), and a plurality of memory chips MD1 to MD4. The plurality of memory chips MD1 to MD4 may include a first memory chip MD1, a second memory chip MD2, a third memory chip MD3, and a fourth memory chip MD4. At least some of the plurality of memory chips MD1 to MD4 may include a plurality of through electrodes 93. The plurality of bumps 89, 489, 589, and 689 may include a plurality of first bumps 89, a plurality of second bumps 489, a plurality of third bumps 589, and a plurality of fourth bumps 689.

The PCB PC may include a rigid PCB, a flexible PCB, or a rigid-flexible PCB. The PCB PC may include a multi-layered circuit substrate. The PCB PC may correspond to a package substrate or a main board. The plurality of fourth bumps 689 may be disposed on a lower surface of the PCB PC. The interposer IP may be disposed on the PCB PC. The plurality of third bumps 589 may be disposed between the PCB PC and the interposer IP. In the case where the PCB PC corresponds to a main board, the interposer IP may correspond to a package substrate.

The plurality of semiconductor chips CP, LD, and MD1 to MD4 may be disposed on the interposer IP. The interposer IP may include a semiconductor substrate such as a silicon interposer. In an embodiment, the microprocessor CP and the control chip LD are disposed on the interposer IP. The plurality of second bumps 489 may be disposed between the microprocessor CP and the interposer IP and between the control chip LD and the interposer IP. The microprocessor CP may include various kinds of processors such as a graphics processing unit (GPU) or an application processor (AP). The control chip LD may include various elements such as a memory controller. The control chip LD may be connected to the microprocessor CP via the interposer IP and the plurality of second bumps 489.

The plurality of memory chips MD1 to MD4 may be sequentially stacked on the control chip LD. Each of the plurality of memory chips MD1 to MD4 may include a plurality of components which are similar to those described with reference to FIGS. 1 to 8. For instance, each of the plurality of memory chips MD1 to MD4 may include the plurality of first bumps 89. In an embodiment, the plurality of first bumps 89 may be disposed between the plurality of memory chips MD1 to MD4 and between the first memory chip MD1 and the control chip LD. The plurality of memory chips MD1 to MD4 may be connected to the control chip LD via the plurality of first bumps 89 and the plurality of through electrodes 93.

The encapsulant 99 may be disposed on the control chip LD to cover the plurality of memory chips MD1 to MD4. The encapsulant 99 may include an epoxy molding compound (EMC), an underfill, or a combination thereof.

In an exemplary embodiment, the control chip LD may include a master chip. Each of the plurality of memory chips MD1 to MD4 may denote a slave chip. In an exemplary embodiment, the first memory chip MD1 may denote a master chip. Each of the second memory chip MD2, the third memory chip MD3, and the fourth memory chip MD4 may denote a slave chip.

Referring to FIGS. 9 and 10, the third memory chip MD3 may include a through electrode 93, a protruding electrode 95, a substrate insulating layer 97, a substrate 21, a plurality of interlayer insulating layers 31, 32, 33, 34, and 35, a plurality of middle interconnections 41 and 42, a plurality of contact plugs 52, a pad 61, a plurality of upper interconnections 62, a plurality of protective insulating layers 71 and 72, and a first bump 89. The substrate insulating layer 97 may cover one surface of the substrate 21. The substrate 21 may be disposed between the substrate insulating layer 97 and first interlayer insulating layer 31. The protruding electrode 95 may be disposed on the substrate insulating layer 97. The through electrode 93 may pass through the substrate 21 and be connected to a corresponding one of the plurality of first middle interconnections 41 and the protruding electrode 95. In an embodiment, the through electrode 93 may pass through the substrate 21 and be connected to a corresponding one of the plurality of second middle interconnections 42 or the pad 61.

The second memory chip MD2 may include a configuration similar to that of the third memory chip MD3. A solder 87 of the third memory chip MD3 may be adhered to the protruding electrode 95 of the second memory chip MD2. The solder 87 of the fourth memory chip MD4 may be adhered to the protruding electrode 95 of the third memory chip MD3.

Referring to FIGS. 9 to 11, each of the plurality of semiconductor chips CP, LD, and MD1 to MD4 may include a plurality of active/passive elements. In an embodiment, the plurality of active/passive elements may include a plurality of cell transistors 149 and a plurality of cell capacitors 159 which are disposed on the substrate 21.

For example, each of the plurality of memory chips MD1 to MD4 may include the substrate 21, a device isolation layer 123, a sixth interlayer insulating layer 131, a seventh interlayer insulating layer 132, the plurality of cell transistors 149, a bit line BL, plurality of buried contact plugs BC, and the plurality of cell capacitors 159. Each of the plurality of cell transistors 149 may include a gate electrode 141, a gate dielectric layer 143, and plurality of source/drain regions 145. Each of the plurality of cell capacitors 159 may include a first electrode 151, a capacitor dielectric layer 153, and a second electrode 155.

The plurality of cell transistors 149 and the plurality of cell capacitors 159 may constitute a plurality of memory cells MC. Each of the plurality of cell transistors 149 may correspond to a recessed channel transistor. In an embodiment, each of the plurality of cell transistors 149 may include a fin field effect transistor (finFET), a multi-bridge channel (MBC) transistor, a nanowire transistor, a vertical transistor, a recessed channel transistor, a three-dimensional (3D) transistor, planar transistor, or a combination thereof. The first electrode 151 may be referred to as a lower electrode, a storage electrode, or a storage node. The second electrode 155 may be referred to as an upper electrode, a plate electrode, or a plate node. Each of the plurality of cell capacitors 159 may include various kinds of three-dimensional (3D) capacitors.

The sixth interlayer insulating layer 131 may be disposed at a similar level to the first interlayer insulating layer 31 of FIG. 1. The seventh interlayer insulating layer 132 may be disposed at a similar level to the second interlayer insulating layer 32 or the third interlayer insulating layer 33 of FIG. 1. The plurality of cell transistors 149 and the plurality of cell capacitors 159 may be electrically connected to at least one of the plurality of middle interconnections 41 and 42, the pad 61, and the plurality of upper interconnections 62 of FIG. 1 corresponding thereto.

FIGS. 12 to 19 are cross-sectional views for describing methods of forming semiconductor devices according to embodiments of the inventive concept.

Figure 12:
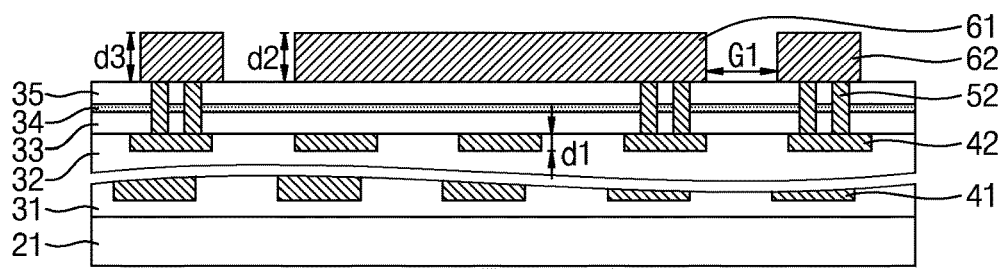
FIGS. 12 to 22 are cross-sectional views for describing methods of forming semiconductor devices according to embodiments of the inventive concept.

Referring to FIG. 12, a plurality of interlayer insulating layers 31, 32, 33, 34, and 35, a plurality of middle interconnections 41 and 42, a plurality of contact plugs 52, a pad 61, and a plurality of upper interconnections 62 are formed on a substrate 21. The plurality of interlayer insulating layers 31, 32, 33, 34, and 35 may include a first interlayer insulating layer 31, a second interlayer insulating layer 32, a third interlayer insulating layer 33, a fourth interlayer insulating layer 34, and a fifth interlayer insulating layer 35. The plurality of middle interconnections 41 and 42 may include a plurality of first middle interconnections 41 and a plurality of second middle interconnections 42.

The substrate 21 may include a semiconductor substrate such as a silicon wafer or a silicon-on-insulator (SOI) wafer. The plurality of interlayer insulating layers 31, 32, 33, 34, and 35 may be stacked on the substrate 21. The plurality of interlayer insulating layers 31, 32, 33, 34, and 35 may include silicon oxide, silicon nitride, silicon oxynitride, a low-k dielectric, a high-k dielectric, or a combination thereof. The fourth interlayer insulating layer 34 may correspond to an etch stop layer. The fourth interlayer insulating layer 34 may include, or be formed of, a different material from the fifth interlayer insulating layer 35. For example, the first interlayer insulating layer 31, the second interlayer insulating layer 32, the third interlayer insulating layer 33, and the fifth interlayer insulating layer 35 may include silicon oxide, and the fourth interlayer insulating layer 34 may include silicon nitride.

Each of the plurality of middle interconnections 41 and 42 and the plurality of contact plugs 52 may include or be formed of a conductive material, such as a metal, a metal nitride, a metal silicide, a metal oxide, polysilicon, a conductive carbon, or a combination thereof. Each individual middle interconnection 41 or 42 may have an integral structure formed of a continuous, monolithic material. In an embodiment, the plurality of first middle interconnections 41 may be formed in the first interlayer insulating layer 31. The plurality of second middle interconnections 42 may be formed in the second interlayer insulating layer 32. Each of the plurality of second middle interconnections 42 may exhibit a first thickness d1.

The plurality of contact plugs 52 may extend into one or more of the plurality of interlayer insulating layers 31, 32, 33, 34, and 35. In an embodiment, each of the plurality of contact plugs 52 passes through the fifth interlayer insulating layer 35, the fourth interlayer insulating layer 34, and the third interlayer insulating layer 33 and contacts a corresponding one of the plurality of second middle interconnections 42. The formation of the plurality of middle interconnections 41 and 42 and the plurality of contact plugs 52 may include a plurality of thin-film forming processes and a patterning process.

The pad 61 and the plurality of upper interconnections 62 may be formed on the fifth interlayer insulating layer 35. The formation of the pad 61 and the plurality of upper interconnections 62 may include a thin-film forming process and a patterning process. The pad 61 and each of the plurality of upper interconnections 62 may include or be formed of a conductive material, such as a metal, a metal nitride, a metal silicide, a metal oxide, polysilicon, a conductive carbon, or a combination thereof. The pad 61 and each of the plurality of upper interconnections 62 may include a single layer or a multi-layered structure. The pad 61 and each of the plurality of upper interconnections 62 may each have integral structure formed of a continuous, monolithic material. In an embodiment, the pad 61 and each of the plurality of upper interconnections 62 may include or be formed of aluminum (Al), copper (Cu), nickel (Ni), cobalt (Co), silver (Ag), platinum (Pt), ruthenium (Ru), tungsten (W), tungsten nitride (WN), titanium (Ti), titanium nitride (TiN), tantalum (Ta), tantalum nitride (TaN), or a combination thereof.

The plurality of middle interconnections 41 and 42 may be formed between the pad 61 and the substrate 21. The pad 61 and each of the plurality of upper interconnections 62 may contact at least a corresponding one of the plurality of contact plugs 52. In an embodiment, from among the plurality of middle interconnections 41 and 42, a selected one of the plurality of second middle interconnections 42 is closest to a center of the pad 61, from a top-down view.

The pad 61 may exhibit a second thickness d2. Each of the plurality of upper interconnections 62 may exhibit a third thickness d3. In an embodiment, the pad 61 and the plurality of upper interconnections 62 may include and be formed of the same material formed simultaneously. The third thickness d3 may be substantially equal to the second thickness d2. The pad 61 and the plurality of upper interconnections 62 may be formed at substantially the same vertical level. The second thickness d2 may be greater than the first thickness d1. The second thickness d2 may be twice to 100 times the first thickness d1. The second thickness d2 may be 1 μm or more. In an embodiment, the second thickness d2 may range from 1 μm to 5 μm. For example, the second thickness d2 may be about 2.5 μm.

Each of the plurality of upper interconnections 62 may be formed adjacent to the pad 61 (e.g., in a horizontal direction). Each gap G1 between the plurality of upper interconnections 62 and the pad 61 may be 1 μm or more. Each of the gaps G1 between the plurality of upper interconnections 62 and the pad 61 may range from 1 μm to 10 μm. In an embodiment, each of the gaps G1 may range from 2.5 μm to 7.2 μm. Each of the gaps G1 between the plurality of upper interconnections 62 and the pad 61 may be greater than or equal to the second thickness d2.

Figure 13:
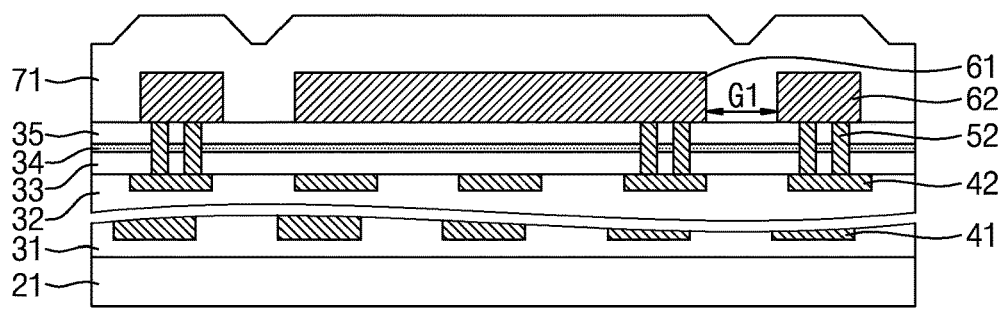

Referring to FIG. 13, a first protective insulating layer 71 is formed on the fifth interlayer insulating layer 35. The first protective insulating layer 71 may cover the pad 61, the plurality of upper interconnections 62, and the gaps G1 between the pad 61 and the plurality of upper interconnections 62. The first protective insulating layer 71 may include or be formed of silicon oxide, silicon nitride, silicon oxynitride, a low-k dielectric, or a combination thereof. In an embodiment, the first protective insulating layer 71 may include a silicon oxide layer formed using tetraethylorthosilicate (TEOS). An upper surface of the first protective insulating layer 71 may be formed at a higher level than uppermost ends (e.g., top surfaces) of the pad 61 and the plurality of upper interconnections 62.

Figure 14:
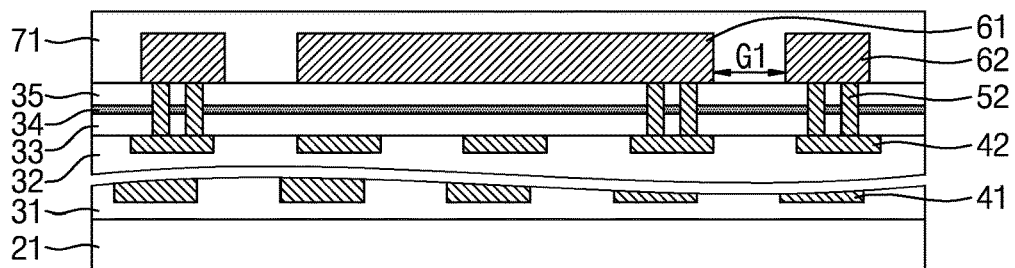

Referring to FIG. 14, the upper surface of the first protective insulating layer 71 may be formed using a planarization process to be substantially planar. The planarization process may include a chemical mechanical polishing (CMP) process, an etchback process, or a combination thereof. In an embodiment, the first protective insulating layer 71 covers the pad 61, the plurality of upper interconnections 62, and the gaps G1 between the pad 61 and the plurality of upper interconnections 62.

Figure 15:
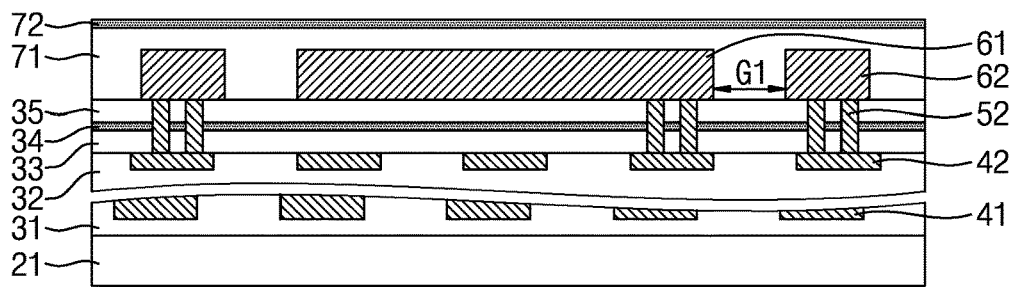

Referring to FIG. 15, a second protective insulating layer 72 is formed on the first protective insulating layer 71. The second protective insulating layer 72 may include a different material from the first protective insulating layer 71. In an embodiment, the second protective insulating layer 72 includes silicon nitride. The second protective insulating layer 72 may cover the upper surface of the first protective insulating layer 71 with a constant thickness. An upper surface of the second protective insulating layer 72 may be formed to be substantially planar.

Figure 16:
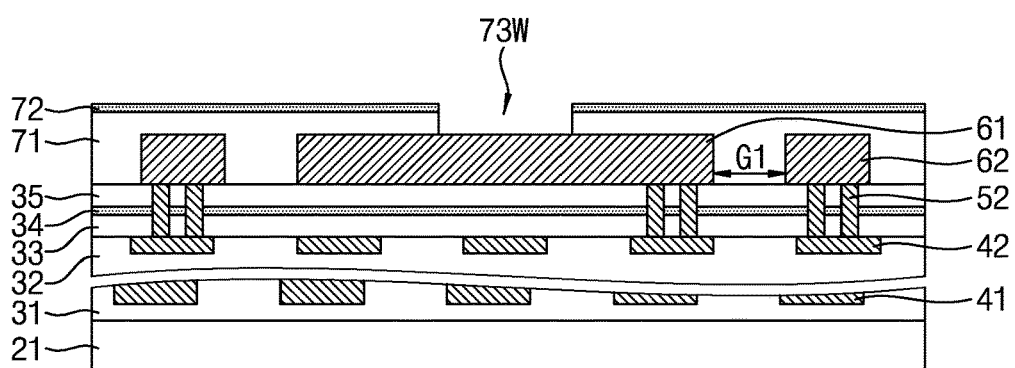

Referring to FIG. 16, an opening 73W may be formed using a patterning process to pass through the second protective insulating layer 72 and the first protective insulating layer 71 and expose an upper surface of the pad 61. In an embodiment, the opening 73W may be arranged within a center of the pad 61. An edge of the pad 61 may remain covered by the first protective insulating layer 71 and the second protective insulating layer 72. The opening 73W may exhibit various cross-sectional shapes such as a rectangular shape, or a trapezoidal shape having a lower horizontal width smaller than an upper horizontal width thereof. In the following descriptions, the lower and upper horizontal widths of the opening 73W may be assumed to be substantially the same. From a top-down view, the opening 73W may have a circular shape, a square or rectangular shape, or a linear shape, for example.

Figure 17:
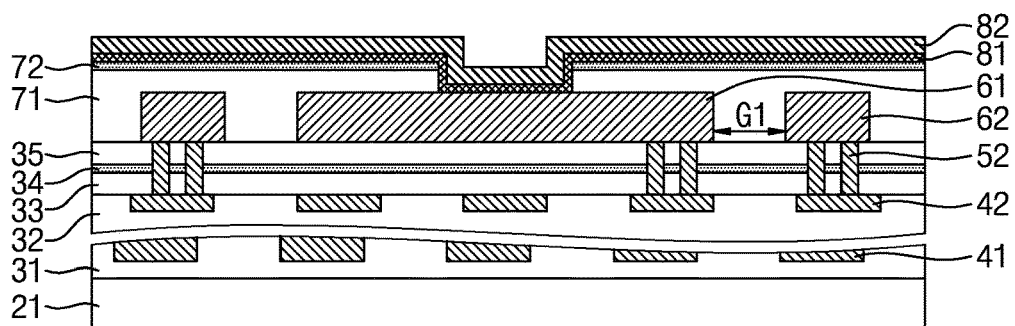

Referring to FIG. 17, a barrier layer 81 and a seed layer 82 are sequentially formed on the second protective insulating layer 72. The barrier layer 81 may include or be formed of titanium (Ti), titanium nitride (TiN), tantalum (Ta), tantalum nitride (TaN), or a combination thereof. The seed layer 82 may include or be formed of copper (Cu). The barrier layer 81 may extend into the opening 73W. The barrier layer 81 contact the upper surface of the pad 61. The seed layer 82 conformally covers an upper surface of the barrier layer 81.

Figure 18:
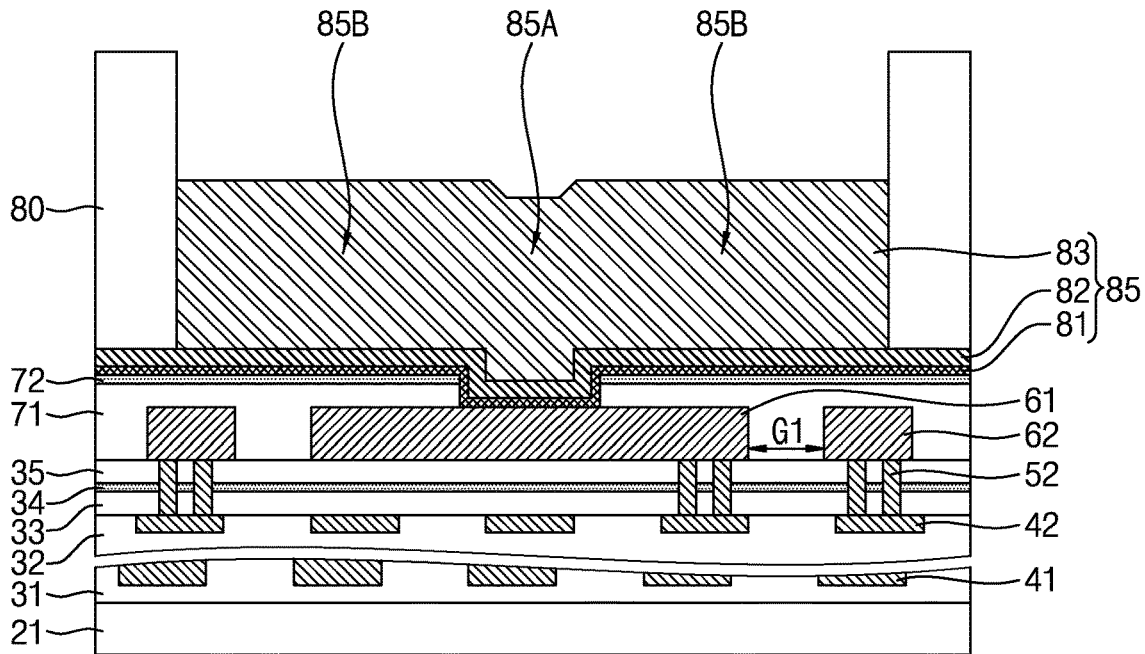

Referring to FIG. 18, a mask pattern 80 is formed on the seed layer 82. A pillar 83 is formed on the seed layer 82. The pillar 83 may include or be formed of nickel (Ni), copper (Cu), aluminum (Al), silver (Ag), platinum (Pt), ruthenium (Ru), tin (Sn), gold (Au), tungsten (W), tungsten nitride (WN), titanium (Ti), titanium nitride (TiN), tantalum (Ta), tantalum nitride (TaN), or a combination thereof. For example, the pillar 83 may include a nickel layer. The pillar 83 may be formed using an electroplating process. The pillar 83 may be defined by the mask pattern 80.

The barrier layer 81, the seed layer 82, and the pillar 83 may constitute a pillar structure 85. The pillar structure 85 may include a first portion 85A and a second portion 85B.

The first portion 85A may be arranged on the opening 73W. The second portion 85B may extend on the second protective insulating layer 72. The second portion 85B may overlap the edge of the pad 61, the plurality of upper interconnections 62, and the gaps G1 between the pad 61 and the plurality of upper interconnections 62.

An upper surface of the first portion 85A may be closer to the substrate 21 than an upper surface of the second portion 85B is to the substrate. A lower surface of the second portion 85B may be formed to be substantially planar. The upper surface of the second portion 85B may be formed to be substantially planar.

Figure 19:
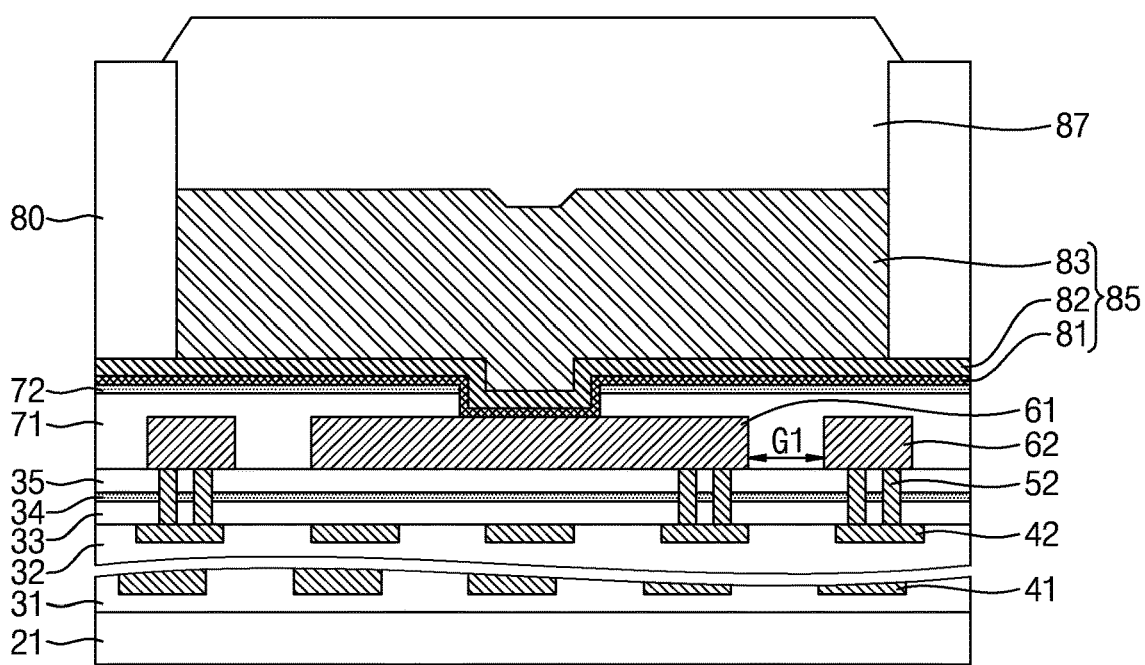

Referring to FIG. 19, a solder 87 is formed on the pillar structure 85. The solder 87 may include or be formed of Sn, Ag, Cu, Ni, Au, or a combination thereof. For example, the solder 87 may be a Sn—Ag—Cu layer. An interfacial metal layer may be further formed between the pillar structure 85 and the solder 87, but a description thereof will be omitted for brevity.

Referring again to FIGS. 1 and 19, the mask pattern 80 may be removed to expose side surfaces of the pillar 83 and the solder 87. The seed layer 82 and the barrier layer 81 may be partially removed to partially expose the upper surface of the second protective insulating layer 72. The seed layer 82 and the barrier layer 81 may be defined between the pad 61 and the pillar 83, between the second protective insulating layer 72 and the pillar 83 on the edge of the pad 61, between the second protective insulating layer 72 and the pillar 83 on the gaps G1 between the pad 61 and the plurality of upper interconnections 62, and between the second protective insulating layer 72 and the pillar 83 on the plurality of upper interconnections 62.

The solder 87 may be rounded using an annealing process such as a reflow process. In an embodiment, a lateral width of the solder 87 may be greater than that of the pillar 83. An upper surface of the solder 87 may have a curved, hemispherical shape.

Figure 20:
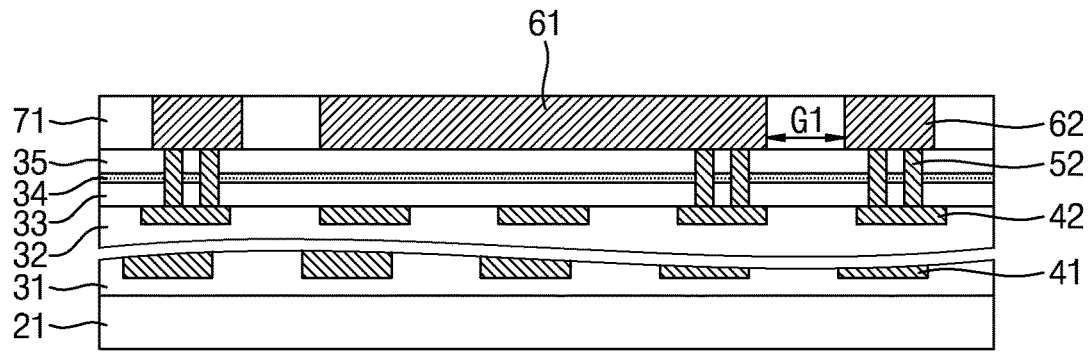
Figure 21:
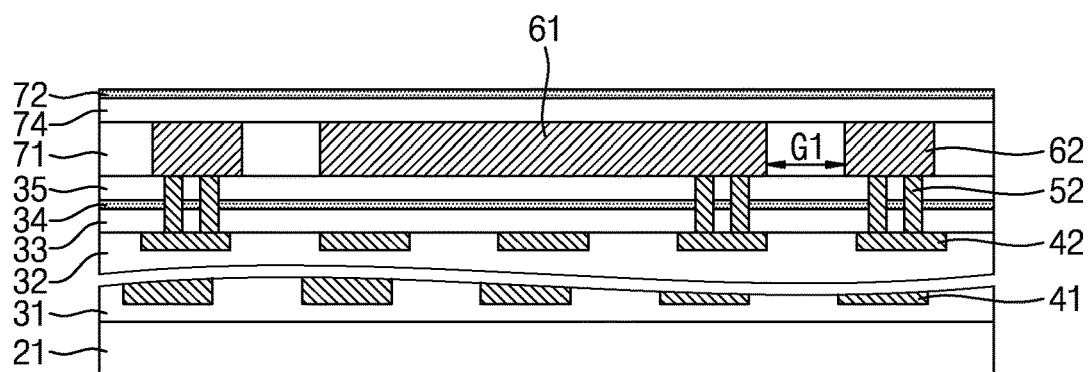
Figure 22:
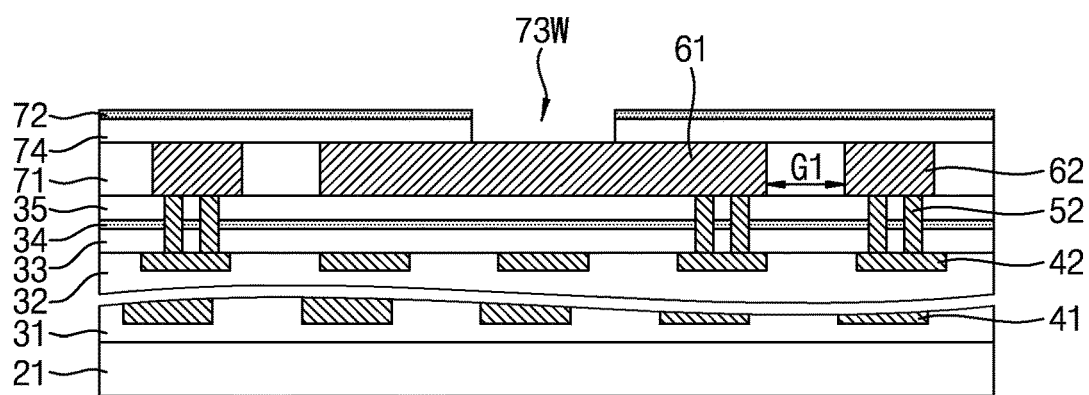

FIGS. 20 to 22 are cross-sectional views for describing methods of forming semiconductor devices according to embodiments of the inventive concept.

Referring to FIG. 20, an upper surface of a first protective insulating layer 71 may be formed using a planarization process to be substantially planar. Upper surfaces of the first protective insulating layer 71, a pad 61, and a plurality of upper interconnections 62 may be substantially coplanar and exposed. The first protective insulating layer 71 may fill gaps G1 between the pad 61 and the plurality of upper interconnections 62.

Referring to FIG. 21, a third protective insulating layer 74 is formed on the first protective insulating layer 71, the pad 61, and the plurality of upper interconnections 62. A second protective insulating layer 72 may be formed on the third protective insulating layer 74. The third protective insulating layer 74 may include a different material from the second protective insulating layer 72. For example, each of the first protective insulating layer 71 and the third protective insulating layer 74 may include a silicon oxide layer formed using tetraethylorthosilicate (TEOS). The second protective insulating layer 72 may include a silicon nitride layer. Each of upper surfaces of the first protective insulating layer 71, the third protective insulating layer 74, and the second protective insulating layer 72 may be formed to be substantially planar.

Referring to FIG. 22, an opening 73W may be formed using a patterning process to pass through the second protective insulating layer 72 and the third protective insulating layer 74 and expose the upper surface of the pad 61.

According to the example embodiments of the inventive concept, a pad and an upper interconnection can be provided that have thicknesses which are at least twice a thickness of a middle interconnection. A protective insulating layer can cover an edge of the pad, the upper interconnection, and a gap between the pad and the upper interconnection and have an opening on the pad. A bump can be disposed on the pad. The bump can extend on the protective insulating layer and overlap the upper interconnection. The gap between the pad and the upper interconnection can be 1 µm or more. An upper surface of the protective insulating layer can be substantially planar. A semiconductor device having excellent current drivability, a high signal transmission rate, and high physical/chemical reliability can be implemented.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
a first semiconductor chip and a second semiconductor chip adjacent to each other in a first direction,
the first semiconductor chip comprising,
  a first substrate having a first front surface and a first rear surface opposite to each other;
  first interconnections on the first front surface of the first substrate;
  a first interlayer insulating layer covering the first interconnections;
  a first pad and first wirings on the first interlayer insulating layer, and electrically connected to the first interconnections;
  a first protective insulating layer covering the first pad and the first wirings and having a first opening exposing a portion of the first pad;
  a first bump on the first protective insulating layer and electrically connected to the first pad;
  a first protruding electrode on the first rear surface of the first substrate; and
  a first through electrode extending in the first substrate in the first direction and electrically connecting the first protruding electrode and the first interconnections to each other,
the second semiconductor chip comprising,
  a second substrate having a second front surface and a second rear surface opposite to each other;
  second interconnections on the second front surface of the second substrate;
  a second interlayer insulating layer covering the second interconnections;
  a second pad and second wirings on the second interlayer insulating layer, and electrically connected to the second interconnections;
  a second protective insulating layer covering the second pad and the second wirings and having a second opening exposing a portion of the second pad; and
  a second bump on the second protective insulating layer and including a pillar structure electrically connected to the second pad and a solder connecting the pillar structure and the first protruding electrode,
wherein a thickness of the second pad in the first direction is greater than a thickness of each of the second interconnections in the first direction,
wherein a width of a gap between the second pad and the second wirings adjacent to each other in a second direction, perpendicular to the first direction, is greater than or equal to the thickness of the second pad in the first direction,
wherein the pillar structure has a first side having a convex portion within the second opening of the second protective insulating layer, and a second side having a concave portion aligned with the convex portion in the first direction, wherein the second side is in contact with the solder of the second bump,
wherein the first protruding electrode has a third side in contact with the solder of the second bump and substantially flat,
wherein the second protective insulating layer includes a first protective layer on the second pad and the second wirings, a second protective layer on the first protective layer, and a third protective layer on the second protective layer, and
wherein the second opening of the second protective insulating layer has a narrow region penetrating through the first and second protective layers, and a wide region penetrating through the third protective layer and exposing a portion of the second protective layer in the first direction.

2. The semiconductor device as claimed in claim 1, wherein the thickness of the second pad is twice to 100 times the thickness of each of the second interconnections.

3. The semiconductor device as claimed in claim 1, wherein a thickness of the second wirings in the first direction is substantially equal to the thickness of the second pad.

4. The semiconductor device as claimed in claim 1, wherein the thickness of the second pad is 1 µm or more.

5. The semiconductor device as claimed in claim 1, wherein the thickness of each of the second interconnections is less than 1 µm.

6. The semiconductor device as claimed in claim 1, wherein the width of the gap between the second pad and the second wirings adjacent to each other is 1 µm or more.

7. The semiconductor device as claimed in claim 1, wherein the convex portion of the pillar structure contacts the second pad.

8. The semiconductor device as claimed in claim 1, wherein the concave portion of the pillar structure is recessed from the second side of the pillar structure toward the first side of the pillar structure.

9. The semiconductor device as claimed in claim 1, wherein the concave portion of the pillar structure overlaps the convex portion of the pillar structure in the first direction.

10. The semiconductor device as claimed in claim 1, wherein a thickness of the second protective layer in the first direction is smaller than a thickness of the first protective layer in the first direction and a thickness of the third protective layer in the first direction.

11. The semiconductor device as claimed in claim 1, wherein the first protective layer includes silicon oxide,
the second protective layer includes silicon nitride, and
the third protective layer includes photosensitive polyimide (PSPI).

12. The semiconductor device as claimed in claim 1, wherein the wide region of the second opening has a first inner wall defined by the third protective layer, and
the first inner wall of the wide region is tapered towards the narrow region of the second opening.

13. The semiconductor device as claimed in claim 12, wherein the narrow region of the second opening has a second inner wall defined by the first protective layer and the second protective layer, and the second inner wall of the narrow region has angles relative to the second direction greater than that of the first inner wall of the wide region.

14. A semiconductor device comprising:
a first semiconductor chip and a second semiconductor chip adjacent to each other in a first direction,
the first semiconductor chip comprising,
a first substrate having a first front surface and a first rear surface opposite to each other;
a first bump on the first front surface of the first substrate;
a protruding electrode on the first rear surface of the first substrate; and
a through electrode extending in the first substrate in the first direction and electrically connecting the protruding electrode and the first bump to each other,
the second semiconductor chip comprising,
a second substrate having a second front surface and a second rear surface opposite to each other, the second front surface facing the first rear surface of the first substrate;
interconnections on the second front surface of the second substrate;
an interlayer insulating layer covering the interconnections;
a pad and wirings on the interlayer insulating layer, and electrically connected to the interconnections;
a protective insulating layer covering the pad and the wirings and having an opening exposing a portion of the pad; and
a second bump on the opening of the protective insulating layer and including a pillar structure electrically connected to the pad and a solder electrically connecting the pillar structure and the protruding electrode of the first semiconductor chip to each other,
wherein a thickness of the pad in the first direction is greater than a thickness of each of the interconnections in the first direction,
wherein a width of a gap between the pad and the wirings adjacent to each other in a second direction, perpendicular to the first direction, is greater than or equal to the thickness of the pad in the first direction,
wherein the pillar structure has a first side electrically connected to the pad, and a second side electrically connected to the solder of the second bump, and
wherein the protruding electrode has a third side electrically connected to the solder of the second bump.

15. The semiconductor device as claimed in claim 14, wherein the first semiconductor chip further comprises a substrate insulating layer between the first rear surface of the first substrate and the protruding electrode, and
the through electrode penetrates through the substrate insulating layer.

16. The semiconductor device as claimed in claim 14, wherein the first side of the pillar structure has a convex portion in contact with the pad, and
the second side of the pillar structure has a concave portion recessed toward the convex portion.

17. The semiconductor device as claimed in claim 14, wherein the third side of the protruding electrode is a planar surface.

18. The semiconductor device as claimed in claim 14, wherein the protective insulating layer include a first protective layer on the pad and the wirings, a second protective layer on the first protective layer, and a third protective layer on the second protective layer, and
wherein the opening of the protective insulating layer has a first region passing through the first and second protective layers, and a second region passing through the third protective layer.

19. The semiconductor device as claimed in claim 18, wherein a width of the first region of the opening in the second direction is smaller than that of the second region of the opening.

20. A semiconductor device comprising:
a first semiconductor chip and a second semiconductor chip adjacent to each other in a first direction,
the first semiconductor chip comprising,
a first substrate having a first front surface and a first rear surface opposite to each other;
a first bump on the first front surface of the first substrate;
a protruding electrode on the first rear surface of the first substrate; and
a through electrode extending in the first substrate in the first direction and electrically connecting the protruding electrode and the first bump to each other,
the second semiconductor chip comprising,
a second substrate having a second front surface and a second rear surface opposite to each other, the second front surface facing the first rear surface of the first substrate;
interconnections on the second front surface of the second substrate;
an interlayer insulating layer covering the interconnections;
a pad on the interlayer insulating layer, and electrically connected to the interconnections;
a protective insulating layer covering the pad; and
a second bump on the protective insulating layer and including a pillar structure electrically connected to the pad and a solder on the pillar structure,
wherein a thickness of the pad in the first direction is greater than a thickness of each of the interconnections in the first direction,
wherein the pillar structure has a first convex portion in contact with the pad passing through the protective insulating layer,
wherein the solder has a second convex portion overlapping the first convex portion of the pillar structure in the first direction,
wherein the protruding electrode has a planar surface in contact with the solder, and
wherein the first convex portion includes a first horizontal surface in contact with the pad, and a second horizontal surface spaced apart from the pad in the first direction, the second horizontal surface has a step difference from the first horizontal surface.

* * * * *